United States Patent [19]
Powers, Jr.

[11] Patent Number: 5,674,606
[45] Date of Patent: Oct. 7, 1997

[54] ELECTRICALLY CONDUCTIVE FLAME RETARDANT MATERIALS AND METHODS OF MANUFACTURE

[75] Inventor: Donald H. Powers, Jr., Needham, Mass.

[73] Assignee: Parker-Hannifin Corporation, Cleveland, Ohio

[21] Appl. No.: 418,065

[22] Filed: Apr. 6, 1995

[51] Int. Cl.$^6$ ........................................ B32B 5/16
[52] U.S. Cl. .................... 428/328; 428/332; 428/403; 428/920; 428/407
[58] Field of Search ...................... 428/323, 328, 428/332, 403, 920, 407

[56] References Cited

U.S. PATENT DOCUMENTS

| | | | |
|---|---|---|---|
| 4,021,592 | 5/1977 | Fromson | 428/209 |
| 4,434,541 | 3/1984 | Powers, Jr. | 29/526 R |
| 4,507,359 | 3/1985 | Powers, Jr. | 428/328 |
| 4,535,029 | 8/1985 | Intrater et al. | 428/408 |
| 4,545,926 | 10/1985 | Fouts, Jr. et al. | 252/511 |
| 4,566,990 | 1/1986 | Liu et al. | 252/503 |
| 4,596,670 | 6/1986 | Liu | 252/511 |
| 4,716,081 | 12/1987 | Ehrreich | 428/403 |
| 4,769,280 | 9/1988 | Powers, Jr. | 428/328 |
| 4,871,477 | 10/1989 | Dimanshteyn | 252/609 |
| 5,019,415 | 5/1991 | Oehr et al. | 427/39 |
| 5,296,020 | 3/1994 | Reichert et al. | 106/1.11 |
| 5,378,407 | 1/1995 | Chandler et al. | 252/513 |

FOREIGN PATENT DOCUMENTS 2218422  11/1989  United Kingdom .

OTHER PUBLICATIONS

Electrolytic and Chemical Conversion Coatings, T. Biestek and J. Weber, p. 201, Portcullis Press Ltd. Redhill (1976).

*Primary Examiner*—H. Thi Le
*Attorney, Agent, or Firm*—Wolf Greenfield & Sacks, P.C.

[57] ABSTRACT

Electrically conductive, flame retardant material and method of making same as well as method of use in an electromagnetic interference shielding material. The electrically conductive, flame retardant material comprises alumina trihydrate material treated to form an aluminum phosphate surface and an electrically conductive layer disposed thereover. In the form of particles, the electrically conductive, flame retardant material may be dispersed throughout a polymeric material to provide a flame retardant EMI shielding material. Such materials may be used as, for example, gaskets, caulking compounds, coatings and adhesives.

10 Claims, 1 Drawing Sheet

ELECTRICALLY CONDUCTIVE FLAME RETARDANT MATERIALS AND METHODS OF MANUFACTURE

BACKGROUND

1. Field of the Invention

The invention generally relates to electrically conductive, flame retardant materials and the method of making same, and more specifically to their use in flame retardant, EMI shielding material.

2. Discussion of the Related Art

Many electronic devices require certain Underwriters Laboratories (UL) approval for flame retardancy. This electronic equipment includes personal and business computers as well as more industrially relevant equipment such as base stations for telephones and switching electronics.

If each individual component of such an apparatus has UL flame retardancy approval, the overall apparatus does not require UL flame retardancy approval. Thus, ensuring UL flame retardancy approval of each component reduces cost to the manufacturer in labor, time and government fees which results in a cheaper product for the consumer. However, at the same time that each component of such a device may need to exhibit an acceptable level of flame retardancy, it may also need to possess certain other chemical or physical properties. For example, while the gaskets in switching electronics should be flame retardant according to UL standards, the gaskets also need to be substantially elastic and provide good electromagnetic interference (EMI) shielding which requires that the gaskets be electrically conductive.

It has been known to provide EMI shielding gaskets by filling a polymeric material with conductive particles such as silver or silver-coated particles as disclosed in U.S. Pat. No. 4,434,541, 4,507,359 and 4,769,280 all to Powers, Jr. However, while these gaskets exhibit good EMI shielding, they do not provide flame retardancy at a level sufficient to obtain UL approval in many cases.

Flame retardant, EMI shielding gaskets have been produced by including a flame retardant material such as alumina trihydrate (ATH) in a polymeric material filled with conductive particles. However, due to the substantially large loading (i.e., weight percentage) of these fillers within the polymeric material, the elastic properties of these gaskets are reduced to the point that the filled polymeric material cannot function optimally as a gasket in all cases.

SUMMARY OF THE INVENTION

Therefore, it is an object of the present invention to provide a method of making a flame retardant, electrically conductive material.

It is another object of the present invention to provide such a flame retardant, electrically conductive material.

It is yet another object of the present invention to provide a polymeric material which includes such an electrically conductive, flame retardant material and provides both substantial flame retardancy and good EMI shielding.

Accordingly, one embodiment of the present invention includes a method for forming a flame retardant, electrically conductive ATH material. The method comprises treating the ATH material with a conditioning solution which is nondegrading to ATH to form a surface comprising aluminum phosphate and forming an electrically conductive layer thereover.

Another embodiment of the present invention includes an ATH material having an electrically conductive layer adhered thereto after treatment of the ATH material to form an aluminum phosphate surface.

In a further embodiment of the present invention, a flame retardant, EMI shielding material is provided which includes a polymeric material and ATH particles having an electrically conductive layer adhered thereto after treatment of the ATH particles to form an aluminum phosphate surface.

Preferably, the present invention includes a flame retardant, EMI shielding gasket which comprises a silicone polymeric material and alumina trihydrate particles having an aluminum phosphate surface treatment and a layer of silver thereover. The silver preferably comprises about 12% of the alumina trihydrate particles, and the alumina trihydrate particles preferably comprise about 68% of the gasket by weight. Preferably, the gasket provides a volume electrical resistivity of at most about 10 mΩ-cm. Preferably, the tensile strength, durometer and density of the gasket are about 206 psi, 76 Shore A, and 1.81 g/cc, respectively. In addition, this gasket has a flame retardancy rating (UL 94) of VO.

It is a feature of the present invention that the electrically conductive ATH material be in the form of particles having a size from 5 microns to 200 microns, more preferably from 40 microns to 80 microns. It is another feature of the present invention that the ATH particles have a surface area from 0.25 $m^2/g$ to 0.45 $m^2/g$, more preferably from 0.30 $m^2/g$ to 0.40 $m^2/g$.

It is a further feature of the present invention that the flame retardant, EMI shielding material have a volume electrical resistivity of at most 50 mΩ-cm, preferably at most 20 mΩ-cm and, more preferably at most 10 mΩ-cm as determined by Mil-G-83528 standard of paragraph 4.6.11. It is yet another feature of the present invention that the flame retardant, EMI shielding material have a Shore A durometer rating of from 55 to 85, more preferably from 65 to 75 as measured according to ASTM D2240. It is a further feature of the present invention that the flame retardant, EMI shielding material have a tensile strength from 100 psi to 450 psi according to ASTM D412. It is yet another feature of the present invention that the flame retardant, EMI shielding material have a tear strength from 30 ppi to 50 ppi. It is still another feature of the present invention that the flame retardant, EMI material have a UL flame retardancy rating of 94 V-0 or V-1 at a thickness from 0.010" to 0.050", more preferably from 0.020" to 0.040", most preferably from 0.025" to 0.035".

The term "polymeric material" as used herein denotes a material comprising a macromolecule formed by the chemical unison of several monomer units. Examples of polymeric materials include silicone, fluorosilicone and polyisobutyl rubbers. Other polymeric materials include EPDM, polyamides, acrylics, urethanes, polyvinylchloride and other materials conventionally used in gaskets, adhesives, caulking compounds and coatings.

The term "particle" is meant to include a portion of material comprising any shape, including substantially spherical shapes and flat platelets.

The term "EMI shielding material" as used herein denotes a material which substantially prevents the passage of electromagnetic radiation therethrough.

The term "nondegrading" defines a solution which does not dissolve alumina trihydrate. ATH is soluble in both strong acid and strong bases. Therefore, a nondegrading solution must not have a pH such that it is a strong acid or a strong base.

The term "adherent" as used herein denotes a substantially strong bonding between two materials such as silver and an aluminum phosphate surface on the ATH material. For example, a material comprising a layer of silver adhered to an aluminum phosphate surface of ATH material withstands the stresses involved with incorporating the material into a polymeric material using a two-roll mill.

By an "aluminum phosphate surface" on the ATH material it is meant that the ATH material includes an amount of aluminum phosphate on its surface sufficient to form a stable layer for metallic deposition thereover to provide an electrically conductive material according to the method of the present invention.

DETAILED DESCRIPTION

Figure 1:
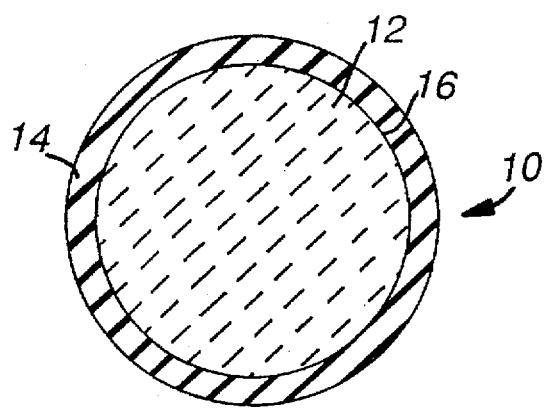
FIG. 1 is a cross-sectional view of an alumina trihydrate particle having an electrically conductive layer adhered thereto after treatment of the ATH particle to form an aluminum phosphate surface.
Figure 2:
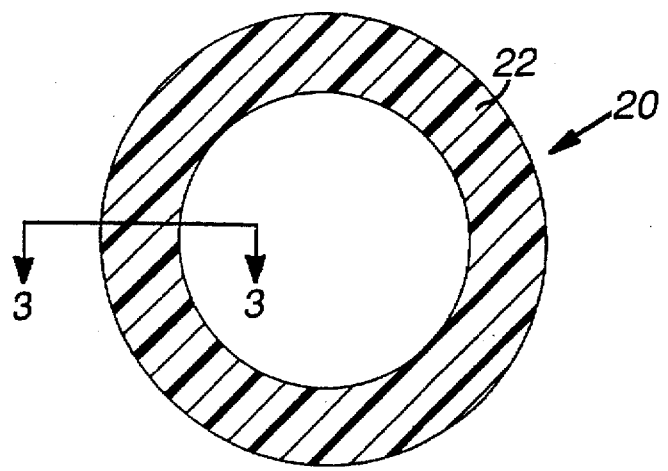
FIG. 2 is a plan view of a circular O-ring type flame retardant, EMI shielding gasket comprising a polymeric material and particles of the material of FIG. 1.
Figure 3:
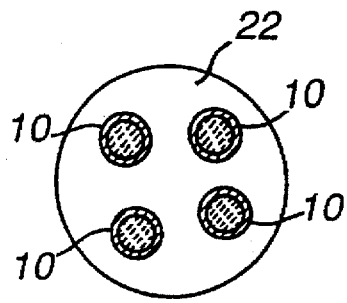
FIG. 3 is a cross-sectional view of the flame retardant, EMI shielding gasket according to FIG. 2.

The present invention relates to the materials as shown in FIGS. 1–3. FIG. 1 depicts a material 10 which comprises an ATH particle 12 with an electrically conductive layer 14 adhered thereto after treatment of the ATH particle 12 to form an aluminum phosphate layer 16 as described below. FIG. 2 represents a flame retardant, EMI shielding gasket 20 produced by using the material 10 of FIG. 1 in the form of particles as fillers in a polymeric material 22 according to the method of the present invention.

Preferably, the alumina trihydrate material 12 has an empirical formula which is essentially $Al_2O_3 \cdot 3H_2O$ or $Al(OH)_3$. In a particularly preferred embodiment, the alumina trihydrate material 12 comprises particles. In another preferred embodiment, the particles range in size from 5 microns to 200 microns, as measured by a Micro-trac particle size analyzer which is a product of Leeds and Northrop located in St. Petersburg, Fla. or an equivalent technique. More preferably, the particles range in size from 40 microns to 80 microns. Preferably, the ATH material 12 has a purity of at least about 99%. However in some cases the material 12 can contain other materials such as $Al_2O_3$ but in all cases the material 12 has a high enough content of ATH to have a flame retardant UL 94 V-0 rating at a thickness of at most 0.050". It should be noted that by alumina trihydrate material 10 it is not meant to refer to partially hydrated alumina ($Al_2O_3$) such as, for example, alumina which is in contact with an aqueous solution since this material does not have the desired empirical formula.

The phosphate layer 16 of the alumina trihydrate material has been analyzed using x-ray photoelectron spectroscopy which demonstrates that phosphorus in the form of phosphate is present at the surface of the ATH material subsequent to the treatment now described. An aluminum phosphate layer 16 is formed on the ATH material by exposing the ATH material to a nondegrading conditioning solution containing phosphate $PO_4^{3-}$) ions in an amount sufficient to form the aluminum phosphate surface 16 on the ATH material 12. Preferably, this reaction is carried out at atmospheric pressure and at a temperature from about 5° C. to about 25° C. Generally, this reaction is carried out for about 5 minutes although shorter or longer time periods may be used depending on the conditioning solution. Typically, the nondegrading conditioning solution comprises a substantially polar solvent such as, for example, an aqueous solution or an ethanolic solution.

The source of the phosphate ions may be any source which provides phosphate ions in an amount sufficient to form an aluminum phosphate surface on the ATH material. Examples of such sources include alkali phosphate salts, alkaline phosphate salts, the mono-basic salts of phosphoric acid and phosphoric acid. In one preferred embodiment, the nondegrading conditioning solution includes monosodium phosphate dissolved in deionized water. In another preferred embodiment, the nondegrading conditioning solution includes monopotassium phosphate dissolved in deionized water. In yet another preferred embodiment, the nondegrading conditioning solution comprises monosodium phosphate dissolved in deionized water so that the solution has a pH of at least 2. In still another preferred embodiment, the nondegrading conditioning solution comprises monopotassium phosphate dissolved in deionized water so that the solution has a pH of at least 2. In one preferred embodiment, the nondegrading conditioning solution comprises phosphoric acid dissolved in deionized water. In another preferred embodiment, the nondegrading conditioning solution includes phosphoric acid dissolved in deionized water so that the solution has a pH of at least 2.

The electrically conductive layer 14 is preferably formed over the phosphate surface of the alumina trihydrate material by an electroless process which is distinct from an electrochemical process which generally includes the use of electrodes or the existence of a substantially anistoropic potential through the solution. In some cases, coating can be carried out by processes other than electroless coating such as standard electrochemical techniques.

Preferably, the electrically conductive layer 14 comprises an adherent layer over the aluminum phosphate surface 16 of the ATH material 12. In one preferred embodiment, the electrically conductive layer 14 is substantially uniform as measured by scanning electron microscopy or an equivalent technique. The electrically conductive layer 14 may comprise any metal or alloy which forms an adherent layer over the aluminum phosphate surface of the ATH material. Such metals and alloys include copper, nickel, gold, palladium, platinum, tin, cobalt, silver or mixtures thereof.

The electrically conductive layer 14 preferably comprises from about 7% to about 20% of the material by weight, more preferably from about 10% to about 17% by weight, and most preferably from about 12% to about 15% by weight. In a particularly preferred embodiment, the electrically conductive layer comprises silver.

Flame retardant, EMI shielding materials according to the present invention comprise a polymeric material carrying an electrically conductive ATH material preferably uniformly mixed therein and produced according to the method of the present invention. Preferably, the polymeric material comprises an elastomer. In one preferred embodiment, the flame retardant, EMI shielding material has a resistivity such that it may be used generally as an electrically conductive material. FIGS. 2 and 3 depict one embodiment of a flame retardant, EMI shielding material 20 in the form of a gasket in which the electrically conductive, ATH material 10 of the present invention is uniformly intermixed in the polymeric material 22. Preferably, the polymeric material 22 comprises silicone rubbers, fluorosilicone rubbers, or polyisobutylene rubbers, Ethylene-Propylene-diene monomer rubbers, polyamides, acrylic polymers, urethane polymers, silicone gum, polyvinylchloride or other conventional polymeric materials used for gaskets, adhesives, caulking compounds and coatings. According to the present invention, silicone rubbers include, but are not limited to, aryl, alkylene and alkyl silicones such as phenyl silicone, methyl silicone and methyl vinyl silicone. In a particularly preferred embodiment, the polymeric material comprises a silicone polymer.

Preferably, the electrically conductive, ATH material 10 used in the polymeric material 22 is in the form of particles. In a more preferred embodiment, the size range of the particles 10, as measured using a Microtrac II particle size analyzer from Leeds and Northrop located in St. Petersburg, Fla. or an equivalent technique, is from about 5 microns to about 200 microns, most preferably about 40 microns to about 80 microns. In one preferred embodiment, the electrically conductive layer 14 of these electrically conductive ATH particles 10 comprises silver. The electrically conductive, ATH particles 10 preferably comprise from about 61% to about 75% of the flame retardant, EMI shielding material by weight, more preferably from about 66% to about 70% by weight, and most preferably about 68% by weight. In a particularly preferred embodiment, the flame retardant, EMI material comprises a gasket including silver coated ATH particles and a silicone polymer, wherein the silver coated ATH particles comprise about 68% of the gasket by weight.

The following examples of the present invention are illustrative only and are not intended to be in any way limiting.

EXAMPLE I

Flame retardant, electrically conductive alumina trihydrate particles according to the present invention are made or produced as described below. This reaction is carried out entirely at atmospheric pressure and about 20° C. 250 grams of Alcoa C-31 ATH particles supplied by Alcoa Industrial Chemicals Division, Bauxite, Ark. are dispersed in 1.5 liters of deionized water. 5 milliliters of 85% phosphoric acid is added, and this suspension is stirred for five minutes to form an aluminum phosphate surface on the ATH particles. These particles are separated from the suspension and rinsed 5 times with deionized water to remove any excess acid and then re-suspended in deionized water. Aqueous solutions containing 0.0006 grams of sodium borohydride, 24.3 grams of glycine, and 27.5 grams of silver nitrate are then added consecutively to the suspension. A solution of 6% hydrazine in deionized water is added over a period of 7½ minutes until essentially no silver remains in the suspension. These particles are separated from the suspension and rinsed twice with deionized water and re-suspended in deionized water.

In a second plating step, aqueous solutions containing 24.3 grams of glycine and 27.5 grams of silver nitrate and 6% hydrazine are added to the suspension to reduce the silver. The addition of the hydrazine solution is carried out for 7½ minutes until essentially no silver remains in solution. The resulting particles are separated from the suspension, rinsed 5 times with deionized water, oven dried, and then heat treated 1 hour at 200° C. This method produces electrically conductive ATH particles which comprise about 12% by weight silver.

EXAMPLE II

Flame retardant, electrically conductive alumina trihydrate particles according to the present invention are made or produced as described below. This reaction is carried out entirely at atmospheric pressure and about 20° C. 250 grams of Alcoa C-31 ATH particles purchased from Alcoa Industrial Chemicals Division, Bauxite, Ark. are dispersed in 1.5 liters of deionized water. 5 milliliters of 85% phosphoric acid is added and this suspension is stirred for five minutes. These particles are separated from the suspension and rinsed 5 times with deionized water to remove any excess acid. Aqueous solutions containing 0.0006 grams of sodium borohydride, 30.7 grams of glycine, and 34.75 grams of silver nitrate are then added consecutively to a suspension of the treated powder. A 6% solution of hydrazine is added over a period of 7½ minutes until essentially no silver remains in solution. These particles are separated from the suspension and rinsed twice with deionized water. In a second plating step, aqueous solutions containing 30.7 grams of glycine, 34.75 grams of silver nitrate and 6% hydrazine added to the suspension to reduce the silver. The addition of the hydrazine solution is carried out for 7½ minutes until no silver remains in solution. The powder is then separated from the suspension, rinsed 5 times with deionized water, oven dried, and then heat treated 1 hour at 200° C. This method produces electrically conductive ATH particles which comprise about 15% by weight silver.

EXAMPLE III

Flame retardant, electrically conductive alumina trihydrate particles according to the present invention are made or produced as described below. This reaction is carried out entirely at atmospheric pressure and about 20° C. 250 grams of Alcoa C-31 ATH particles purchased from Alcoa Industrial Chemicals Division, Bauxite, Ark. are dispersed in 1.5 liters of deionized water. A solution of deionized water containing 22 g of monosodium phosphate is added and this suspension is stirred for five minutes. These particles are separated from the suspension and rinsed 5 times with deionized water to remove any excess acid. Aqueous solutions containing 0.0006 grams of sodium borohydride, 30.7 grams of glycine, and 34.75 grams of silver nitrate are then added consecutively to a suspension of the treated powder. A 6% solution of hydrazine is added over a period of 7½ minutes until essentially no silver remains in solution. These particles are separated from the suspension and rinsed twice with deionized water.

In a second plating step, aqueous solutions containing 30.7 grams of glycine, 34.75 grams of silver nitrate and 6% hydrazine added to the suspension to reduce the silver. The addition of the hydrazine solution is carried out for 7½ minutes until no silver remains in solution. The powder is then separated from the suspension, rinsed 5 times with deionized water, oven dried, and then heat treated 1 hour at 200° C. This method produces electrically conductive ATH particles which comprise about 15% by weight silver.

EXAMPLE IV

A flame retardant, EMI shielding gasket according to the present invention is produced as follows. One hundred (100) grams of silicone gum purchased from Dow Corning, Midland, Mich. is mixed on a two-roll mill manufactured by Reliable Rubber and Plastic Machinery Co., North Bergen, N.J. along with 10 grams of fumed silica and 6 grams of processing aids. One (1) gram of 50% active 2,5-dimethyl-2,5 bis(t-butyl peroxy) hexane (VAROX DBPH 50 from R. T. Vanderbilt, Norwalk, Conn. is added to the mixture. Two hundred fifty six (256) grams of silver coated alumina trihydrate produced according to the method described in Example 1 is milled into the formulation. The material is loaded onto a mold and cured under a pressure of at least about 750 p.s.i. for 10 minutes at 350° F. The material is postcured at 400° F. for 1 hour. The material produced by this process has the following properties. The volume electrical resistivity (measured by compressing a disk between two silver electrodes under 100 psi of pressure) is 0.007 ohm-cm. The tensile strength is 206 psi. The material has a hardness of 76 shore A. The material has a UL rating of 94 V-0 at 0.030" thick. The density of the material is 1.81 grams/cc.

EXAMPLE V

A flame retardant, EMI shielding gasket according to the present invention is produced as follows. One hundred (100) grams of methyl-vinyl silicone base purchased from Dow Corning, STI, Monroe, Conn. (E-549V) is mixed on a two-roll mill manufactured by Reliable Rubber and Plastic Machinery Co., North Bergen, N.J. along with 1.5 grams of processing aid. One (1) gram of 50% active 2,5-dimethyl-2,5 bis(t-butyl peroxy) hexane (VAROX DBPH 50 from R. T. Vanderbilt, Norwalk, Conn. is added to the mixture. Two hundred fifty six (256) grams of silver coated alumina trihydrate produced according to the method described in Example 1 is milled into the formulation. The material is loaded onto a mold and cured under a pressure of at least about 750 p.s.i. for 10 minutes at 350° F. The material is postcured at 400° F. for 1 hour. The material produced by this process has the following properties. The volume resistivity (measured by compressing a disk between two silver electrodes under 100 psi of pressure) is 0.012 ohm-cm. The tensile strength is 378 psi. The material has a hardness of 81 shore A. The material has a UL rating of 94 V-0 at 0.030" thick. The density of the material is 1.86 grams/cc.

EXAMPLE VI

A flame retardant, EMI shielding gasket according to the present invention is produced as follows. One hundred (100) grams of methyl-vinyl silicone polymer (SE-6035) purchased from GE Silicones, Waterford, N.Y. is mixed on a two-roll mill manufactured by Reliable Rubber and Plastic Machinery Co., North Bergen, N.J. along with one (1) gram of 50% active 2,5-dimethyl-2,5 bis(t-butyl peroxy) hexane (VAROX DBPH 50 from R. T. Vanderbilt, Norwalk, Conn. Two hundred five (205) grams of silver coated alumina trihydrate produced according to the method described in Example 1 is milled into the formulation. The material is loaded onto a mold and cured under pressure for 10 minutes at 350° F. The material is postcured at 300° F. for 1 hour. The material produced by this process has the following properties. The volume resistivity (measured by compressing a disk between two silver electrodes under 100 psi of pressure) is 0.231 ohm-cm. The tensile strength is 254 psi. The material has a hardness of 72 shore A. The material has a UL rating of 94 V-1 at 0.030" thick. The density of the material is 1.81 grams/cc.

Although certain embodiments of the present invention have been disclosed herein, it is to be understood that variations in the constituents of these embodiments are intended to be within the spirit and scope of this disclosure. For example, while the polymeric materials of the present invention are preferably elastomers, in certain applications, it is not necessary that the polymeric material be an elastomer. In addition, while depicted herein as being in the shape of an O-ring gasket, the flame retardant, EMI shielding material may comprise a gasket in any desired shape having any desired cross-section. The flame retardant, EMI shielding material may be molded or extruded. Moreover, while the flame retardant, EMI shielding material is preferably in the form of a gasket, it may also comprise a flame retardant, EMI shielding material or an electrical conductor in any required shape.

Having thus described a few particular embodiments of the invention, various alterations, modifications and improvements will readily occur to those skilled in the art. Such alterations, modifications and improvements are intended to be part of this disclosure are intended to be within the spirit and scope of the invention. Accordingly, the foregoing description is by way of example only and is not intended as limiting. The invention is limited only as defined in the following claims and equivalents thereto.

What is claimed is:

1. A flame retardant, electromagnetic Interference shielding material, comprising:

a plurality of aluminum trihydrate particles having an electrically conductive metal coating adhered thereto after treatment of said aluminum trihydrate with a phosphate-ion providing solution to form a phosphate layer, said plurality of particles being admixed with a polymeric material.

2. A flame retardant, electromagnetic Interference shielding material according to claim 1, wherein said polymeric material is selected from the group consisting of silicone rubbers, fluorosilicone rubbers, polyisobutylene rubbers, polyamides, ethylene-propylene-diene-monomer rubber ("EPDM") acrylic polymers, urethane polymers, polyvinyl chlorides, and mixtures thereof.

3. A flame retardant electromagnetic interference shielding material according to claim 2, wherein said polymeric material comprises a silicone rubbers.

4. A flame retardant, EMI shielding material according to claim 3, wherein said silicone rubbers comprise silicone gum.

5. A flame retardant, electromagnetic interference shielding material according to claim 2, wherein said flame retardant electromagnetic interference shielding material is in the form of an electromagnetic interference shielding gasket.

6. A flame retardant, electromagnetic interference shielding material according to claim 2, wherein each of said plurality of aluminum trihydrate particles has a surface area from about 0.25 $m^2/g$ to about 0.45 $m^2/g$ and each of said particles has a size from about 5 microns to about 200 microns.

7. A flame retardant, electromagnetic interference shielding material according to claim 6, wherein said flame retardant, electromagnetic interference shielding material has a shore A durometer rating from about 55 to about 85 and a tensile strength from about 100 psi to about 450 psi.

8. A flame retardant, electromagnetic interference shielding material according to claim 7, wherein said flame retardant, electromagentic interference material has a tear strength from about 30 ppi to about 50 ppi and a UL flame retardancy rating of at least 94V-1 at a thickness from about 0.010" to about 0.050".

9. A flame retardant electromagnetic interference shielding material, comprising:

a plurality of aluminum trihydrate particles having an electrically conductive metal coating adhered thereto, said plurality of particles being admixed with a polymeric material.

10. A flame retardant electromagnetic interference shielding material according to claim 9, wherein said aluminum trihydrate particles are treated to increase adherence to said conductive metal and said conductive metal is adhered to said treated particles.

* * * * *

UNITED STATES PATENT AND TRADEMARK OFFICE
CERTIFICATE OF CORRECTION

PATENT NO. : 5,674,606
DATED : October 7, 1997
INVENTOR(S) : Donald H. Powers, Jr.

It is certified that error appears in the above-identified patent and that said Letters Patent is hereby corrected as shown below:

In claim 1, line 13, please change "Interference" to --interference--.

In claim 2, line 22, please change "Interference" to --interference--.

In claim 8, line 51, after "interference", please insert --shielding--.

In claim 8, line 53, please change "94V-1" to --94 V-1--.

Signed and Sealed this

Twenty-fourth Day of March, 1998

Attest:

BRUCE LEHMAN

Attesting Officer     Commissioner of Patents and Trademarks